United States Patent
Huang et al.

(10) Patent No.: US 6,958,492 B2
(45) Date of Patent: Oct. 25, 2005

(54) THIN FILM TRANSISTOR STRUCTURE FOR A FIELD EMISSION DISPLAY AND THE METHOD FOR MAKING THE SAME

(75) Inventors: Chun-Yao Huang, Hsinchu (TW); Cheng-Chung Chen, Yilan Hsien (TW); Yu-Wu Wang, Chu Pei (TW); Chen-Ming Chen, Taichung (TW); Huai-Yuan Tseng, Ping Jeng (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/734,288

(22) Filed: Dec. 15, 2003

(65) Prior Publication Data

US 2005/0056846 A1    Mar. 17, 2005

(30) Foreign Application Priority Data

Sep. 15, 2003  (TW) ............................. 92125394 A

(51) Int. Cl.⁷ ......................................... H01L 31/0376
(52) U.S. Cl. ......................... 257/57; 257/72; 257/347
(58) Field of Search ............................. 257/57, 59, 69, 257/72, 347

(56) References Cited

U.S. PATENT DOCUMENTS

| | | | | |
|---|---|---|---|---|
| 5,572,040 | A | * 11/1996 | Reedy et al. | .................. 257/9 |
| 6,188,111 | B1 | * 2/2001 | Kumagai | .................... 257/369 |
| 6,251,733 | B1 | * 6/2001 | Yamazaki | .................... 438/289 |

* cited by examiner

Primary Examiner—Phat X. Cao
Assistant Examiner—Theresa T. Doan
(74) Attorney, Agent, or Firm—Bacon & Thomas, PLLC

(57) ABSTRACT

A thin film transistor structure for a field emission display is disclosed, which has a substrate; a patterned poly-silicon layer having a source area, a drain area, and a channel on the substrate; a patterned first gate metal layer; a first gate-insulating layer sandwiched in between the poly-silicon layer and the first gate metal layer; a patterned second gate metal layer; and a second gate-insulating layer sandwiched in between the poly-silicon layer and the second gate metal layer; wherein the thickness of the second insulating layer is greater than that of the first gate-insulating layer, and the absolute voltage in the channel under the first gate metal layer is less than that under the second gate metal layer when a voltage higher than the threshold voltage thereof is applied to both of the first gate metal layer and the second gate metal layer.

8 Claims, 2 Drawing Sheets

THIN FILM TRANSISTOR STRUCTURE FOR A FIELD EMISSION DISPLAY AND THE METHOD FOR MAKING THE SAME

BACKGROUND OF THE INVENTION

1. Field of the Invention

The present invention relates to a thin film transistor structure and the method for making the same and, more particularly, to a thin film transistor structure for a field emission display and method for making the same.

2. Description of Related Art

Display panels have become more and more important in our daily lives. People transmit information by means of the display panels when using computers and the Internet, as well as TV sets, cell phones, personal digital assistants (PDAs), automobile information systems, etc. Considering weight, volume, of display panels, and users' health, more and more people choose to use flat panel displays instead of cathode-ray-tubes. Among the burgeoning types of display panels, the field emission display has the advantage of high image quality found with the conventional cathode ray tube display. Also, the field emission display has advantages of high yield, fast reacting time, good performance in displaying coordination, having high brightness over 100 fL, light and thin structure, wide range of color temperature, high mobile efficiency, excellent distinguishability of tilted direction, etc. in comparison with the conventional liquid crystal display that has the disadvantages of blurred view angle, limited range of usable temperature, and slow reacting time. Moreover, the field emission display emits light spontaneously. Through the construction of a high efficiency fluorescent film, the field emission display provides outstanding brightness performance even outdoors so it is thought as a quite competitive display panel and is even likely to replace the liquid crystal display.

The principle of the field emission display is similar to that of the traditional cathode-ray-tube display. They both emit electrons to hit the fluorescent medium on a substrate in vacuum. As for the structure, the cathode-ray-tube display emits electron beams by a single electron gun and controls the direction of the electron beams by using a polarization plate. However, the field emission display is composed of hundreds of thousands of active cold emitters, each of which corresponds to a pixel independently, so no polarization plate is needed. As for the working voltage, the cathode-ray-tube display needs a voltage around 15 to 30 kV. On the other hand, the cathode voltage of a field emission display is only less than 1 kV.

U.S. Pat. No. 6,525,453 disclosed a field emission display composed of a plurality of thin film transistors 22, a plurality of carbon nanotubes 24, and a transparent electrode 38 having a fluorescent layer 39, as shown in FIG. 1 of this application. The carbon nanotubes 24 connect the drain electrode 32 of the thin film transistor 22 through the channel 42. However, there is only a thin film transistor 22 for controlling the current of the field emission display in a pixel. When the anode bias is increased and the current through the field emission display is cut off, an extremely large voltage will punch off the device or a gate dielectrics breakdown will occur. As a result, the transistor loses efficacy and the pixel of the field emission display is unable to operate normally.

Therefore, it is desirable to provide a thin film transistor structure for a field emission display to mitigate and/or obviate the aforementioned problems.

SUMMARY OF THE INVENTION

The object of the present invention is to provide a thin film transistor structure for a field emission display so that the voltage is divided by an adjustable and high voltage-durable device, the voltage difference between the end points of a transistor is reduced, thereby the damage to the transistor otherwise caused by high voltage operation is prevented, the driving device is protected, the deterioration of driving devices is avoided, and a stable current source is therefore obtained in a pixel of an active field emission display.

Another object of the present invention is to provide a method for manufacturing a thin film transistor of a field emission display so that a subgate is integrated into the original process, the voltage difference between the end points of a transistor is reduced, thereby the damage to the transistor otherwise caused by high voltage operation is prevented, and no additional photo-mask is needed. Because the subgate-insulating layer is thicker than the gate-insulating layer of prior art, thereby a high voltage-durable transistor is formed and well protected.

To achieve the object, the thin film transistor structure for a field emission display of the present invention includes a substrate having a semiconductor area for forming a thin film transistor; a patterned poly-silicon layer having a source area, a drain area, and a channel on the semiconductor area of the substrate, wherein the source area and the drain area are doped with ions, and the channel is sandwiched in between the source area and the drain area; a patterned first gate metal layer located on the poly-silicon layer; a first gate-insulating layer sandwiched in between the poly-silicon layer and the first gate metal layer; a patterned second gate metal layer located on the poly-silicon layer; and a second gate-insulating layer sandwiched in between the poly-silicon layer and the second gate metal layer; wherein the thickness of the second insulating layer is greater than that of the first gate-insulating layer, and the absolute voltage in the channel under the first gate metal layer is less than that under the second gate metal layer when a voltage higher than the threshold voltage thereof is applied to both of the first gate metal layer and the second gate metal layer.

To achieve the object, the method for manufacturing a thin film transistor of a field emission display of the present invention includes the steps of (a) providing a substrate; (b) forming a patterned poly-silicon layer on the substrate; (c) forming a first gate-insulating layer; (d) forming a patterned first gate metal layer; (e) forming a second gate-insulating layer; and (f) forming a patterned second gate metal layer; wherein the thickness of the second insulating layer is greater than that of the first gate-insulating layer, and the absolute voltage in the channel under the first gate metal layer is less than that under the second gate metal layer when a voltage higher than the threshold voltage is applied to both of the first gate metal layer and the second gate metal layer.

The thin film transistor structure for a field emission display of the present invention includes a substrate made of glass, plastic, quartz, silicon, or metal; a poly-silicon layer having an ion-doped source area and drain area formed on the semiconductor area of the substrate; a first gate metal layer located on the gate area above the poly-silicon layer; a first gate-insulating layer sandwiched in between the poly-silicon layer and the first gate metal layer; a second gate metal layer located on the gate area above the poly-silicon layer; and a second gate-insulating layer sandwiched in between the poly-silicon layer and the second gate metal layer; wherein the thickness of the second insulating layer is greater than that of the first gate-insulating layer so that the second insulating layer can resist a high voltage and the gate-insulating layer breakdown otherwise caused by the high voltage is avoided.

As regards the relative positions of the components of the thin film transistor structure of the present invention, the projection of the first gate metal layer on the poly-silicon layer is preferably discrete, overlapped, or contiguous with that of the second gate metal layer. The first gate metal layer and the second gate metal layer are selectively connected to be short circuit, or disconnected to be open. Moreover, the relative position of the projection of the first gate metal layer or the second gate metal layer on the poly-silicon layer with the source area or the drain area is not restricted. The projection of the first gate metal layer or the second gate metal layer on the poly-silicon layer can be overlapped or non-overlapped with the source area and the drain area.

The type of the thin film transistor of the present invention can be any conventional type. Preferably, the thin film transistor is a P-type MOS (metal-oxide-semiconductor) or an N-type MOS. The material of the active layer of the thin film transistor can be any conventional semiconductor material. Preferably, the material of the active layer of the thin film transistor of the present invention is an element semiconductor or a compound semiconductor. The absolute voltage in the channel under the first gate metal layer is less than that under the second gate metal layer when the thin film transistor is operating. If the thin film transistor is an N-type MOS, the first gate metal layer is closer to the source area than the second gate metal layer. On the other hand, if the thin film transistor is a P-type MOS, the first gate metal layer is closer to the drain area than the second gate metal layer.

The method for manufacturing a thin film transistor of a field emission display of the present invention includes: providing a substrate made of glass, plastic, quartz, silicon, or metal; forming a patterned poly-silicon layer on the substrate; forming a first gate-insulating layer; forming a patterned first gate metal layer; forming a second gate-insulating layer; and forming a patterned second gate metal layer. Furthermore, the thickness of the second insulating layer is greater than that of the first gate-insulating layer, and the absolute voltage in the channel under the first gate metal layer is less than that under the second gate metal layer when the thin film transistor is operating.

The transistor having a subgate of the present invention has a higher $R_{ch}$ and $I_{off}$ than the traditional transistor that has a single gate. The structure of the transistor of the present invention exerts the majority of the voltage on the second gate metal layer, and therefore reduces the voltage exerted on the first gate metal layer. Besides, the second gate-insulating layer is thick enough to sustain the high voltage that may cause a breakdown to the gate-insulating layer and damage the device. As regards the manufacturing process, the second gate metal layer is preferably formed simultaneously with other conductive metal lines, such as the conductive lines that connect the source area, the drain area, or the gate area. That means no additional photo-mask is further needed and the conventional manufacturing process for the transistor having a single gate electrode is still applicable. The approach of the present invention takes the interlayer dielectrics between the first gate metal layer and the conductive lines as the second gate-insulating layer. Hence, the amount of steps of the method for manufacturing a thin film transistor having a subgate of the present invention is the same as the conventional method for manufacturing a thin film transistor having a single gate.

The method for forming the patterned first gate metal layer and second gate metal layer of the present invention can be any manufacturing process for any type of transistors. Preferably, the patterned first gate metal layer and second gate metal layer are formed through photolithography and etching processes. The method for forming the source area and the drain area can be any conventional method for forming a source area and a drain area. Preferably, the source area and the drain area are formed by ion implantation. Moreover, the process flow for forming the source area and the drain area can be any conventional process flow for forming the source area and the drain area. Preferably, the source area and the drain area are formed after the patterned first gate metal layer is formed. The method for manufacturing a thin film transistor of a field emission display of the present invention is optionally to form a passivation layer on the thin film transistor. Preferably, the passivation layer is deposited on the thin film transistor for protecting the transistor. More preferably, an ITO layer or a carbon nanotube is further formed on the passivation layer for forming the electrode of the field emission display, wherein a channel is constructed in the passivation layer to connect the electrode of the field emission display with the drain area of the transistor.

Other objects, advantages, and novel features of the invention will become more apparent from the following detailed description when taken in conjunction with the accompanying drawings.

DETAILED DESCRIPTION OF THE PREFERRED EMBODIMENT

Embodiment 1

Figure 1:
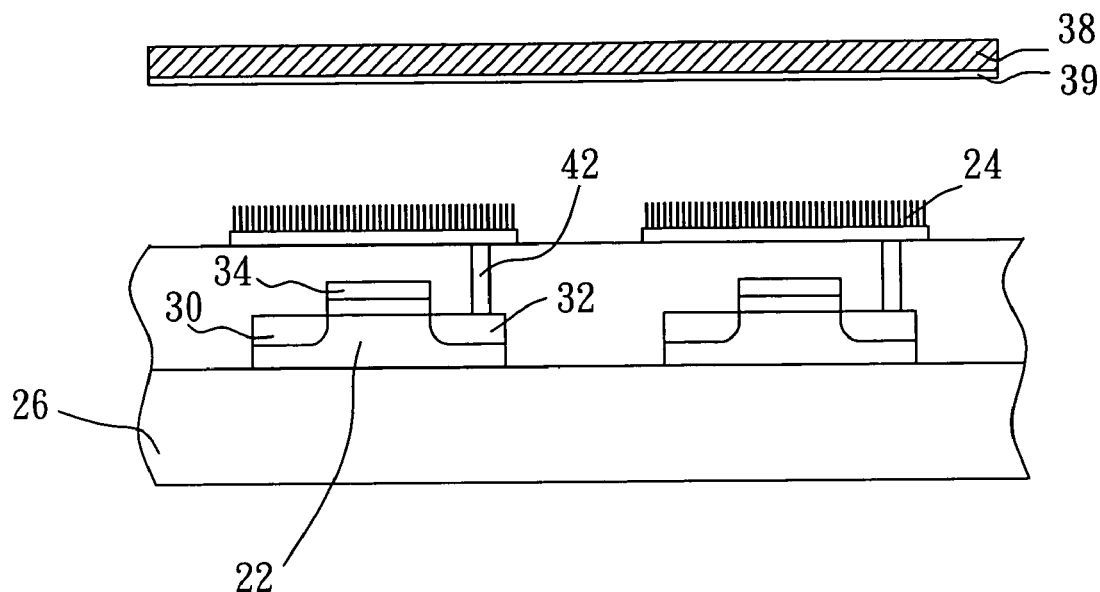
FIG. 1 is a cross-sectional view showing the field emission display of prior art.
Figure 2:
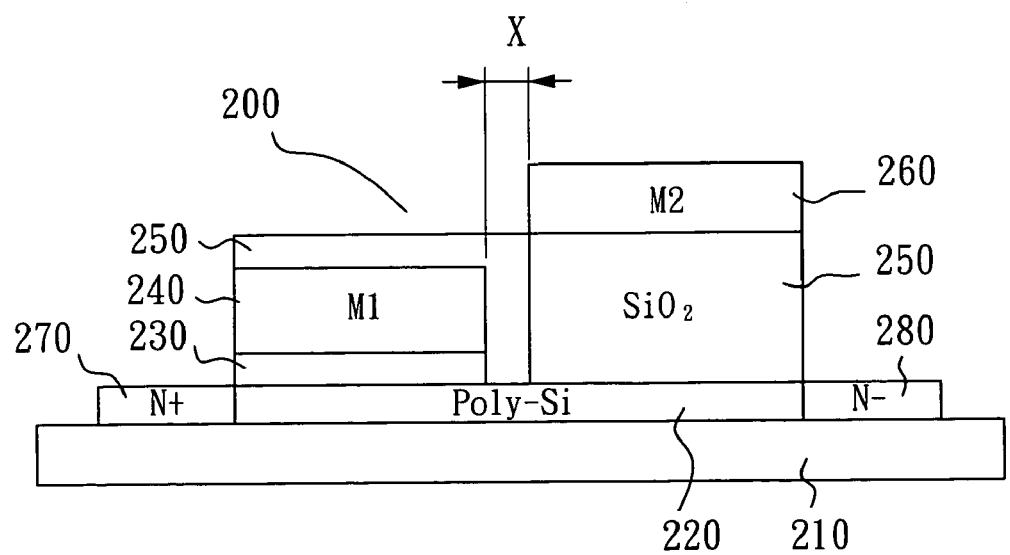
FIG. 2 is a cross-sectional view showing the thin film transistor structure of a preferred embodiment of the present invention.

As shown in FIG. 2, the thin film transistor 200 of the field emission display of the present embodiment is an N-type MOS. The thin film transistor 200 is formed by providing a glass substrate 210, and then forming a patterned poly-silicon layer 220 on the substrate 210. Next, a first gate-insulating layer 230 is deposited and patterned. Afterwards, a patterned first gate metal layer 240, a source area 270 and a drain area 280 of the poly-silicon layer 220 are formed. Subsequently, a second gate-insulating layer 250 is deposited and patterned. Finally, a patterned second gate metal layer 260 is formed. The thickness of the second gate-insulating layer 250 sandwiched in between the poly-silicon layer 220 and the second gate metal layer 260 is thicker than that of the first gate-insulating layer 230 sandwiched in between the poly-silicon layer 220 and the first gate metal layer 240. In addition, the first gate metal layer 240 is closer to the source area 270 of the transistor 200 than the second gate metal layer 260.

The projection of the first gate metal layer 240 on the poly-silicon layer 220 is not overlapped with that of the second gate metal layer 260 on the poly-silicon layer 220. The nearest distance between the projections of the first gate metal layer 240 and the second gate metal layer 260 on the poly-silicon layer 220 is x. The first gate metal layer 240 does not connect to the second gate metal layer 260, so an open circuit is formed therebetween. The projection of the first gate metal layer 240 or the second gate metal layer 260 on the poly-silicon layer 220 is contiguous but not overlapped with the source area 270 or the drain area 280.

In the present embodiment, the thin film transistor having a subgate (the second gate metal layer 260) has a higher $R_{ch}$ and $I_{off}$ than the conventional transistor that has only a single gate metal layer. As a result, the majority of the voltage is exerted on the second gate metal layer 260, and the voltage exerted on the first gate metal layer 240 is therefore reduced. Furthermore, the second gate metal layer 260 can prevent the breakdown of the gate-insulating layer and damage of the device otherwise caused by the high voltage as the gate-insulating layer 250 is relatively thick.

Embodiment 2

Figure 3:
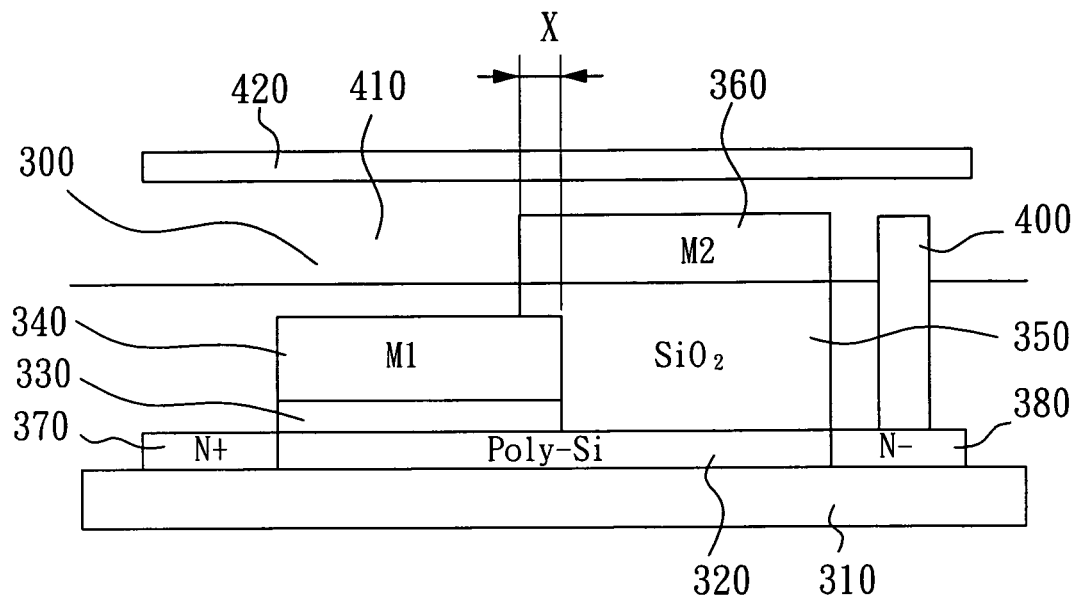
FIG. 3 is a cross-sectional view showing the thin film transistor structure of another preferred embodiment of the present invention.

As shown in FIG. 3, the thin film transistor 300 of the field emission display of the present embodiment is an N-type MOS. The thin film transistor 200 is formed by providing a glass substrate 310, and then forming a patterned poly-silicon layer 320 on the substrate 310. Next, a first gate-insulating layer 330 is deposited and patterned. Afterwards, a patterned first gate metal layer 340, a source area 370 and a drain area 380 of the poly-silicon layer 320 are formed. Then, a second gate-insulating layer 350 is deposited and subsequently etched to form a channel, which exposes the drain area 380 of the transistor 300. Afterwards, a conductive metal layer is deposited and patterned to form the second gate metal layer 360 and the drain conducting line 400. Further, a passivation layer 410 is deposited on the transistor 300 for protecting the transistor, and then an ITO layer 420 is formed on the passivation layer 410 to serve as an electrode of the field emission display. Actually, the drain conducting line 400 connects the ITO layer 420 (not shown in the figure).

In the structure of the thin film transistor 300 of the present embodiment, the thickness of the second gate-insulating layer 350 sandwiched in between the poly-silicon layer 320 and the second gate metal layer 360 is thicker than that of the first gate-insulating layer 330 sandwiched in between the poly-silicon layer 320 and the first gate metal layer 340. In addition, the first gate metal layer 340 is closer to the source area 370 of the transistor 300 than the second gate metal layer 360. The projection of the first gate metal layer 340 on the poly-silicon layer 320 is overlapped with that of the second gate metal layer 360 on the poly-silicon layer 320. The overlapped width of the projections of the first gate metal layer 340 and the second gate metal layer 360 on the poly-silicon layer 320 is x. The first gate metal layer 340 does not connect to the second gate metal layer 360, so an open circuit is formed therebetween. The projection of the first gate metal layer 340 or the second gate metal layer 360 on the poly-silicon layer 320 is contiguous but not overlapped with the source area 370 or the drain area 380.

In the present embodiment, the thin film transistor having a subgate (the second gate metal layer 360) has a higher $R_{ch}$ and $I_{off}$ than the conventional transistor that has only a single gate metal layer. As a result, the majority of the voltage is exerted on the second gate metal layer 360, and the voltage exerted on the first gate metal layer 340 is therefore reduced. Furthermore, the second gate metal layer 360 can prevent the breakdown of the gate-insulating layer and damage of the device otherwise caused by the high voltage as the gate-insulating layer 350 is relatively thick. As for the process integration, the second gate metal layer 360 is formed simultaneously with the electrically conductive lines that connect the source area, the drain area, and the gate area, so no additional processing step or photo-mask is needed as comparing with the conventional process for manufacturing the transistor with a single gate metal layer.

Embodiment 3

Figure 4:
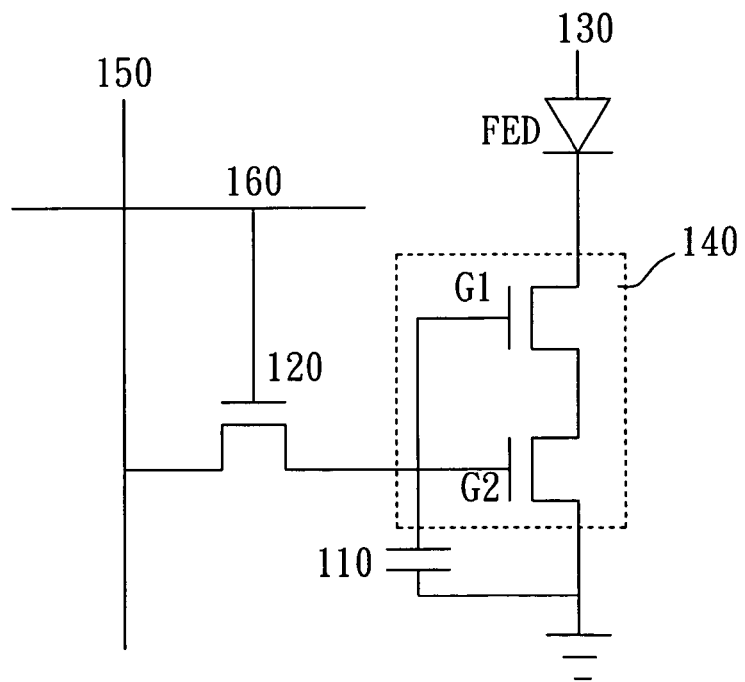
FIG. 4 is a circuit diagram for a pixel containing the thin film transistor structure of the present invention.

With reference to FIG. 4, there is shown a circuit diagram for a pixel of a field emission display. In the present embodiment, the thin film transistor 140 is constructed of the structure illustrated in Embodiment 1. The thin film transistor 140 cooperates with a capacitor 110, a switch 120, and an electrode 130 to form the circuit of a pixel, wherein the switch 120 controls the reading in of the pixel information, and the capacitor 110 serves to restore the pixel information that has been read in. The first gate electrode (G1) and the second gate electrode (G2) of the thin film transistor 140 are voltage-controlled current sources that control the current of the field emission display. The capacitor 110 connects the source area of the thin film transistor 140, whereas the drain area of the thin film transistor 140 connects the electrode 130 of the field emission display. The drain electrode of the switch 120 connects the capacitor 110, the first gate electrode (G1) and the second gate electrode (G2) of the thin film transistor 140; the source electrode of the switch 120 connects the date line 150; and the gate electrode of the switch 120 connects the scan line 160, respectively. When the scan line 160 turns on the switch 120, the capacitor 110 immediately restores the pixel information transmitted by the data line 150. Afterwards, the switch 120 is turned off and the first gate electrode (G1) and the second gate electrode (G2) control the current of the thin film transistor 140 by the capacitor 110. Because the gate-insulating layer of the second gate electrode (G2) is thick enough to endure the high voltage, the first gate electrode (G1) is thus well protected. Furthermore, the second gate electrode (G2) of the thin film transistor 140 and the data line 150 are formed at the same time, and the manufacturing procedures of the transistor having a subgate of the present invention are therefore simplified.

Although the present invention has been explained in relation to its preferred embodiment, it is to be understood that many other possible modifications and variations can be made without departing from the spirit and scope of the invention as hereinafter claimed.

What is claimed is:

1. A thin film transistor structure for a field emission display, comprising:
    a substrate having a semiconductor area for forming a thin film transistor;
    a patterned poly-silicon layer having a source area, a drain area, and a channel on the semiconductor area of the substrate, wherein the source area and the drain area are doped with ions, and the channel is sandwiched in between the source area and the drain area;
    a patterned first gate metal layer located on the poly-silicon layer;
    a first gate-insulating layer sandwiched in between the poly-silicon layer and the first gate metal layer;
    a patterned second gate metal layer located on the poly-silicon layer; and a second gate-insulating layer sandwiched in between the poly-silicon layer and the second gate metal layer;

wherein the thickness of the second insulating layer is greater than that of the first gate-insulating layer, and the absolute voltage in the channel under the first gate metal layer is less than that under the second gate metal layer when a voltage higher than the threshold voltage thereof is applied to both of the first gate metal layer and the second gate metal layer.

2. The thin film transistor structure as claimed in claim 1, wherein the substrate is made of glass, plastic, quartz, silicon, or metal.

3. The thin film transistor structure as claimed in claim 1, wherein the thin film transistor is a P-type MOS (metal-oxide-semiconductor) or an N-type MOS.

4. The thin film transistor structure as claimed in claim 1, wherein the first gate metal layer and the second gate metal layer are shorts or opens.

5. The thin film transistor structure as claimed in claim 1, wherein the projection of the first gate metal layer on the poly-silicon layer is discrete, overlapped, or contiguous with that of the second gate metal layer.

6. The thin film transistor structure as claimed in claim 1, wherein the projection of the first gate metal layer or the second gate metal layer on the poly-silicon layer is overlapped or non-overlapped with the source area and the drain area.

7. The thin film transistor structure as claimed in claim 1, wherein the source area connects to a capacitor that stores the informations for pixel, and the drain area connects to an electrode of a field emission display.

8. The thin film transistor structure as claimed in claim 7, wherein the capacitor, the first gate metal layer, and the second gate metal layer further connect to a drain electrode of a switch, and a source electrode of the switch connects to a data line of the field emission display; or the capacitor, the first gate metal layer, and the second gate metal layer further connect to the source electrode of the switch, and the drain electrode of the switch connects to the data line of the field emission display; and a gate electrode of the switch connects to a scan line of the field emission display.

* * * * *